United States Patent
Maida et al.

(10) Patent No.: US 8,539,797 B2
(45) Date of Patent: Sep. 24, 2013

(54) TITANIA AND SULFUR CO-DOPED QUARTZ GLASS MEMBER AND MAKING METHOD

(75) Inventors: Shigeru Maida, Joetsu (JP); Hisatoshi Otsuka, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 121 days.

(21) Appl. No.: 12/940,405

(22) Filed: Nov. 5, 2010

(65) Prior Publication Data

US 2011/0117480 A1    May 19, 2011

(30) Foreign Application Priority Data

Nov. 16, 2009   (JP) ................. 2009-260558

(51) Int. Cl.
| | |
|---|---|
| *C03B 37/018* | (2006.01) |
| *C03B 19/01* | (2006.01) |
| *C03B 19/06* | (2006.01) |
| *C03C 3/06* | (2006.01) |

(52) U.S. Cl.
USPC .............. 65/416; 65/413; 65/17.3; 65/17.4; 501/54

(58) Field of Classification Search
USPC ............... 501/53, 54; 65/413, 414, 416, 421, 65/427, 17.3, 17.4, 17.6
See application file for complete search history.

(56) References Cited

U.S. PATENT DOCUMENTS

| | | | | |
|---|---|---|---|---|
| 5,958,809 | A * | 9/1999 | Fujiwara et al. | 501/54 |
| 6,800,574 | B2 * | 10/2004 | Anderson | 501/33 |
| 7,429,546 | B2 * | 9/2008 | Iwahashi et al. | 501/54 |
| 7,538,052 | B2 | 5/2009 | Iwahashi et al. | |
| 2004/0025542 | A1 | 2/2004 | Ball et al. | |
| 2005/0272590 | A1 | 12/2005 | Iwahashi et al. | |
| 2008/0103037 | A1 | 5/2008 | Iwahashi et al. | |
| 2009/0122281 | A1 | 5/2009 | Iwahashi et al. | |

FOREIGN PATENT DOCUMENTS

| | | |
|---|---|---|
| JP | 8-031723 A | 2/1996 |
| JP | 2005-104820 A | 4/2005 |
| WO | 00/68718 A1 | 11/2000 |
| WO | 2004/089836 A1 | 10/2004 |

OTHER PUBLICATIONS

European Search Report dated Feb. 17, 2011, issued in corresponding European Patent Application No. 10251903.0.
Agarwal, Anand et al "A simple IR spectroscopic method for determining fictive temperature of silica glasses," Journal of Non-Crystalline Solids, May 1995, vol. 185, pp. 191-198.

* cited by examiner

*Primary Examiner* — Kaj Olsen
*Assistant Examiner* — Noah Wiese
(74) *Attorney, Agent, or Firm* — Westerman, Hattori, Daniels & Adrian, LLP

(57) ABSTRACT

A titania and sulfur co-doped quartz glass member is provided. Due to co-doping of titania and sulfur, the quartz glass member undergoes zero expansion at a certain temperature and low thermal expansion over a wide temperature range, and is thus suited for use in a commercial EUV lithography tool. A manufacturing method and an optical member for EUV lithography are also provided.

11 Claims, 3 Drawing Sheets

TITANIA AND SULFUR CO-DOPED QUARTZ GLASS MEMBER AND MAKING METHOD

CROSS-REFERENCE TO RELATED APPLICATION

This non-provisional application claims priority under 35 U.S.C. §119(a) on Patent Application No. 2009-260558 filed in Japan on Nov. 16, 2009, the entire contents of which are hereby incorporated by reference.

TECHNICAL FIELD

This invention relates to titania and sulfur co-doped quartz glass members which are useful as EUV lithography members, typically photomask substrates and mirror materials having a high surface precision, and a method for manufacturing the same. It also relates to EUV lithography members.

BACKGROUND ART

As is well known in the art, the degree of integration in semiconductor integrated circuits has marked remarkable progresses in recent years. In unison with this tendency, the light source used in the lithography process for the fabrication of semiconductor devices has achieved a substantial reduction of exposure wavelength. The current mainstream lithography uses an ArF excimer laser of 193 nm wavelength. In the drive to achieve a higher degree of integration, the lithography using ArF excimer laser may survive in further developed forms like immersion lithography and double patterning lithography, and a subsequent transition to lithography using extreme ultraviolet (EUV) is regarded promising.

The EUV lithography is expected to use a light source of soft x-ray having a wavelength of up to 70 nm, specifically around 13 nm. Since there are no materials which are highly transmissive in this wavelength range, the EUV lithography has to employ a reflecting optical system. While reflection occurs in this system by a reflective multi-layer film of silicon, molybdenum and other elements deposited on a substrate, a fraction (several tens percents) of incident EUV radiation will not be reflected and reach the underlying substrate where it transforms into heat. Since the EUV lithography uses an extremely short wavelength light source as compared with the conventional lithography technology, the lithography precision can be adversely affected even by a slight thermal expansion of each member (e.g., substrate) in the lithographic optical system induced by the heat that has reached there. Accordingly, members like reflecting mirrors, masks, and stages must be made of low expansion materials. Titania-doped quartz glass is a typical low expansion material. The addition of a certain amount of titania makes it possible to minimize the thermal expansion of quartz glass.

It was anticipated in the art that the temperature rise that substrates experience upon receipt of incident EUV radiation is up to 5° C. It was thus believed that EUV lithography members should be reduced in thermal expansion at a room temperature level (about 19 to 25° C.). However, commercially available EUV lithography tools, that is, exposure tools with increased throughputs are expected to elevate the substrate temperature to about 50 to 80° C. Accordingly, it is necessary to correct the temperature at which the substrate undergoes zero expansion and to develop a material which is reduced in thermal expansion over a wider temperature range on the order of −50° C. to 150° C.

One effective means for broadening the temperature range where titania-doped quartz glass has reduced thermal expansion is by doping titania-doped quartz glass with fluorine and lowering its fictive temperature as disclosed in JP-A 2005-104820. The means of doping titania-doped quartz glass with fluorine and lowering its fictive temperature, however, do not always result in titania-doped quartz glass having a wide temperature range for low thermal expansion. The method of doping titania-doped quartz glass with fluorine is generally by previously providing a titania-doped amorphous silica matrix material, exposing the matrix material to an atmosphere containing fluorine, for example, $SiF_4$, heating and vitrifying. However, $SiF_4$ and similar fluorine-containing gases are often expensive and add to the cost of manufacture.

CITATION LIST

Patent Document 1: JP-A 2005-104820
(WO 2004089836, U.S. Pat. No. 7,538,052)

DISCLOSURE OF INVENTION

An object of the invention is to provide a titania and sulfur co-doped quartz glass member which undergoes zero expansion at a certain temperature and has a wide temperature range for low thermal expansion so that the member is suited for use in a commercially available EUV lithography tool.

Another object is to provide an EUV lithography optical member, typically an EUV lithography photomask substrate and a mirror material, formed of the titania and sulfur co-doped quartz glass member, and a method for preparing the titania and sulfur co-doped quartz glass member.

The inventors have found that co-doping of quartz glass with titania and sulfur is effective to manufacture a titania-doped quartz glass member which undergoes zero expansion at a certain temperature and has a wide temperature range for low thermal expansion so that the member is suited for use in a commercially available EUV lithography tool.

In one aspect, the invention provides a quartz glass member co-doped with titania and sulfur.

Preferably the quartz glass member has a sulfur concentration of at least 10 ppm. Also preferably it contains 3 to 10% by weight of titania.

In a preferred embodiment, the quartz glass member shows a thermal expansion curve having a gradient of $-2.0 \times 10^{-9}/°C.$ to $+2.0 \times 10^{-9}/°C.$ in a temperature range of $-50°C.$ to $150°C.$, more preferably a gradient of $-1.5 \times 10^{-9}/°C.$ to $+1.5 \times 10^{-9}/°C.$ in a temperature range of $0°C.$ to $100°C.$ In a preferred embodiment, the quartz glass member has a coefficient of thermal expansion of $-100 \times 10^{-9}/°C.$ to $+100 \times 10^{-9}/°C.$ in a temperature range of $-50°C.$ to $150°C.$, more preferably a CTE of $-75 \times 10^{-9}/°C.$ to $+75 \times 10^{-9}/°C.$ in a temperature range of $0°C.$ to $100°C.$, and even more preferably a CTE of $-50 \times 10^{-9}/°C.$ to $+50 \times 10^{-9}/°C.$ in a temperature range of $20°C.$ to $80°C.$ Further preferably, the CTE of the quartz glass member becomes zero at a temperature within the temperature range of $0°C.$ to $100°C.$, even more preferably of $20°C.$ to $80°C.$ In another aspect, the invention provides an EUV lithography member comprising the titania and sulfur co-doped quartz glass member defined herein. The EUV lithography member is typically a EUV lithography photomask substrate or mirror material.

In a further aspect, a titania-doped quartz glass member is manufactured by subjecting a feed of a silicon source gas and a titanium source gas to flame hydrolysis with the aid of a combustible gas and a combustion-supporting gas, to form synthetic silica fine particles, depositing the silica fine particles on a rotating target, and concurrently melting and vitrifying the particles to form titania-doped quartz glass. According to the invention, the feed further comprises a sulfur source gas whereby the resultant quartz glass is co-doped with titania and sulfur. Most often, the sulfur source comprises a sulfur oxide or chloride.

ADVANTAGEOUS EFFECTS OF INVENTION

Since the titania and sulfur co-doped quartz glass member undergoes zero expansion at a certain temperature and low thermal expansion over a wide temperature range, the member is suited for use in a commercially available EUV lithography tool. Using the titania and sulfur co-doped quartz glass member, EUV lithography optical members, typically EUV lithography photomask substrates may be constructed.

BRIEF DESCRIPTION OF DRAWINGS

FIG. 5 illustrates a burner system used in Examples, FIG. 5a being a schematic view of the overall system for manufacturing a titania-doped quartz glass ingot and FIG. 5b being a transverse section of the oxyhydrogen flame burner.

DESCRIPTION OF EMBODIMENTS

The quartz glass member of the invention undergoes low thermal expansion over a wide temperature range due to co-doping of quartz glass with titania and sulfur. The titania and sulfur co-doped quartz glass is thus suited for use as an optical member in a commercially available EUV lithography tool.

The EUV lithography is expected to find application to the semiconductor microfabrication technology of 32 nm and 22 nm nodes. To enable such fine size processing, a reflection optical system is used in the EUV lithography. While reflection is provided by a reflective multilayer film of silicon, molybdenum and other elements deposited on a substrate, a fraction (several tens percents) of incident EUV radiation will not be reflected and reach the underlying substrate where it transforms into heat. Since the EUV lithography is extremely short in light source wavelength as compared with the conventional lithography technology, the lithography precision can be adversely affected even by a slight thermal expansion of each member (e.g., substrate) in the lithographic optical system induced by the heat that has reached there. Accordingly, members like reflecting mirrors, masks, and stages must be made of low expansion materials.

It was anticipated in the art that the temperature rise that substrates experience upon receipt of incident EUV radiation is up to 5° C. It was thus believed that EUV lithography members should be reduced in thermal expansion at a room temperature level (about 19 to 25° C.). However, commercially available EUV lithography tools, that is, exposure tools with increased throughputs are expected to elevate the substrate temperature to about 50 to 80° C. Accordingly, it is necessary to correct the temperature at which the substrate undergoes zero expansion and to develop a material which is reduced in thermal expansion over a wider temperature range.

The inventors have found that a titania-doped quartz glass can be reduced in thermal expansion over a wider temperature range (from −50° C. to 150° C.) by co-doping it with sulfur. That is, the titania-doped quartz glass member of the invention contains sulfur as well. Co-doping of sulfur permits titania-doped quartz glass to be reduced in thermal expansion over a wider temperature range so that it may be suited as an optical member mounted in a commercially available EUV lithography tool.

In order to broaden the temperature range over which titania-doped quartz glass undergoes reduced thermal expansion and to suppress generation of inclusions in titania-doped quartz glass for use as an EUV lithography optical member required to have a high surface precision, an amount of sulfur co-doped is preferably greater than or equal to 10 ppm, more preferably greater than or equal to 100 ppm, even more preferably greater than or equal to 500 ppm, and most preferably greater than or equal to 1,000 ppm. Also preferably an amount of sulfur co-doped is less than or equal to 50,000 ppm, more preferably less than or equal to 10,000 ppm, even more preferably less than or equal to 5,000 ppm, and most preferably less than or equal to 2,000 ppm. The sulfur content in titania-doped quartz glass may be measured by ion chromatography.

In order that a titania and sulfur co-doped quartz glass member be reduced in thermal expansion over the exposure temperature range of the EUV lithography, the quartz glass desirably contains 3 to 10% by weight, more desirably 6 to 9% by weight of titania. The titania content in quartz glass may be measured by an electron probe microanalyzer (EPMA).

The titania and sulfur co-doped quartz glass member should preferably show a thermal expansion curve having a gradient of $-2.0\times10^{-9}/°$ C. to $+2.0\times10^{-9}/°$ C. in a temperature range of −50° C. to 150° C., more preferably a gradient of $-1.5\times10^{-9}/°$ C. to $+1.5\times10^{-9}/°$ C. in a temperature range of 0° C. to 100° C. By co-doping titania-doped quartz glass with sulfur in the above-specified concentration, the gradient of its thermal expansion curve over the exposure temperature range of the EUV lithography may be reduced, and wavefront aberration resulting from a temperature change of the optical member may be suppressed. These ensure better lithographic performance. As used herein, the term "gradient of a thermal expansion curve" is a differential value of a thermal expansion curve versus temperature.

Also preferably the titania and sulfur co-doped quartz glass member should have a coefficient of thermal expansion (CTE) of $-100\times10^{-9}/°$ C. to $+100\times10^{-9}/°$ C. in a temperature range of −50° C. to 150° C. More preferable is a CTE of $-75\times10^{-9}/°$ C. to $+75\times10^{-9}/°$ C. in a temperature range of 0° C. to 100° C. Even more preferable is a CTE of $-50\times10^{-9}/°$ C. to $+50\times10^{-9}/°$ C. in a temperature range of 20° C. to 80° C. By co-doping titania-doped quartz glass with sulfur in the above-specified concentration, the absolute value of its CTE in the exposure temperature range of the EUV lithography may be reduced, and wavefront aberration resulting from a temperature change of the optical member may be minimized. These ensure better lithographic performance.

In a preferred embodiment, the titania and sulfur co-doped quartz glass member has a CTE which becomes zero (0) at a temperature within the temperature range of 0° C. to 100° C., more preferably within the temperature range of 20° C. to 80° C. Because of co-doping of quartz glass with titania and sulfur in the above-specified concentrations, the quartz glass may have a CTE of zero at a temperature within the exposure temperature range of the EUV lithography, which is more effective in suppressing the occurrence of wavefront aberration during exposure of the EUV lithography. It is noted that the CTE and the thermal expansion curve may be determined by a thermal dilatometer LIX-2 by Ulvac-Riko, Inc.

It is acceptable that the titania-doped quartz glass contains elements other than silicon, titanium, sulfur, oxygen, hydrogen, and chlorine as long as their content is each less than or equal to 1,000 ppm. For example, the presence of fluorine is expected to contribute to low thermal expansion in a wider temperature range.

The titania and sulfur co-doped quartz glass member is suited as a stock for forming EUV lithography members such as EUV lithography photomask substrates and mirror materials. It is best suited as EUV lithography photomask substrates since the resulting photomask enables transfer of a pattern of high image quality and fine size onto a wafer.

In general, titania and sulfur co-doped quartz glass may be produced by feeding a hydrogen-containing combustible gas and an oxygen-containing combustion-supporting gas to a burner built in a quartz glass-manufacturing furnace, burning the gases to form an oxyhydrogen flame at the burner tip, introducing a silicon source gas feed, a titanium source gas feed, and a sulfur source gas feed into the oxyhydrogen flame for subjecting the silicon and titanium source gas feeds to hydrolysis to produce sulfur-containing silicon oxide, sulfur-containing titanium oxide and composites thereof in fine particle form, depositing and simultaneously melting and verifying the fine particles on a target disposed forward of the burner, continuing growth until a titania-doped quartz glass ingot is formed, hot working the ingot into a predetermined shape, and annealing the shaped ingot. Thus, the method of producing an ingot is so-called direct process. The titania and sulfur co-doped quartz glass may be produced by the above process in which the fine particles are deposited on the target while the flow rates of the combustible gas, combustion-supporting gas, silicon source gas feed, titanium source gas feed, and sulfur source gas feed are controlled within a variation of ±1%, the temperatures of air flowing through the quartz glass-manufacturing furnace, exhaust gas from the furnace, and ambient air surrounding the furnace are controlled within a variation of ±2.5° C., and the target is rotated at a rotational speed of at least 5 rpm.

The quartz glass-manufacturing furnace may be of vertical or horizontal type. The target of a seed or similar material is rotated at a rotational speed of at least 2 rpm, preferably at least 5 rpm, more preferably at least 15 rpm, and most preferably at least 30 rpm. This is because striae, strains or structurally or compositionally non-uniform zones generate, depending largely on the unevenness of temperature in a portion where titania and sulfur co-doped quartz glass grows on the rotating target. Then the generation of structurally or compositionally non-uniform zones in titania and sulfur co-doped quartz glass can be inhibited by increasing the rotational speed of the target so that an even temperature may be available in a portion where titania and sulfur co-doped quartz glass grows. The upper limit of rotational speed of the target may be selected as appropriate although it is usually up to 200 rpm.

The rotational speed of the target may also have an impact on the distribution of OH group concentration in the titania and sulfur co-doped quartz glass, which in turn, has an impact on thermal expansion properties, typically CTE. Thus, in a preferred embodiment, the titania and sulfur co-doped quartz glass has an OH group concentration distribution of up to 200 ppm, more preferably up to 100 ppm, and even more preferably up to 50 ppm. For reducing the OH group concentration distribution, it is preferred to keep in soaked (or evenly heated) condition the growth face during preparation of a titania-doped quartz glass ingot. It is also preferable from the aspect of reducing the OH group concentration distribution that the rotational speed of the target be kept at 5 rpm or higher. An OH group concentration may be measured by an infrared spectrophotometer. Specifically, it may be determined from an absorption coefficient at wavenumber 4522 $cm^{-1}$ as measured by a Fourier transform infrared spectrophotometer, in accordance with the equation:

$$\text{OH group concentration (ppm)} = (\text{absorption coefficient at } 4522\ cm^{-1})/T \times 4400$$

wherein T is a thickness (cm) of a sample.

The generation of structurally or compositionally non-uniform zones in titania and sulfur co-doped quartz glass can also be inhibited by supplying the silicon source gas feed, titanium source gas feed, sulfur source gas feed, combustible gas, and combustion-supporting gas at steady rates. To this end, in the process of the invention, the flow rates of the silicon source gas feed, titanium source gas feed, sulfur source gas feed, combustible gas, and combustion-supporting gas are each controlled within a variation of ±1%, preferably ±0.5%, and more preferably ±0.25%. If the flow rates of the combustible gas, combustion-supporting gas, silicon source gas feed, titanium source gas feed, and sulfur source gas feed each have a variation of more than ±1%, and the temperatures of air flowing through the quartz glass-manufacturing furnace, exhaust gas from the furnace, and ambient air surrounding the furnace each have a variation of more than ±2.5° C., then structurally or compositionally non-uniform zones will generate in titania and sulfur co-doped quartz glass being prepared under such conditions. It is then difficult to obtain titania and sulfur co-doped quartz glass having a high surface precision enough to meet the requirement of EUV lithography members, typically EUV lithography photomask substrates.

The silicon source gas feed used herein may be selected from well-known organosilicon compounds, for example, silicon tetrachloride, chlorosilanes such as dimethyldichlorosilane and methyltrichlorosilane, and alkoxysilanes such as tetramethoxysilane, tetraethoxysilane, and methyltrimethoxysilane.

The titanium source gas feed used herein may also be selected from well-known compounds, for example, titanium halides such as titanium tetrachloride and titanium tetrabromide, and titanium alkoxides such as tetraethoxytitanium, tetraisopropoxytitanium, tetra-n-propoxytitanium, tetra-n-butoxytitanium, tetra-sec-butoxytitanium, and tetra-t-butoxytitanium.

The sulfur source gas feed used herein may also be selected from well-known compounds, for example, sulfur tetrafluoride, sulfur hexafluoride, sulfur dioxide, thionyl chloride, sulfur chloride, and sulfur dichloride. From the standpoints of environment, safety, boiling point and the like, sulfur dioxide, sulfur chloride, and sulfur dichloride are preferred as the sulfur source.

On the other hand, the combustible gas used herein may be one containing hydrogen, optionally in combination with another gas such as carbon monoxide, methane and propane. The combustion-supporting gas used herein may be one containing oxygen.

The titania and sulfur co-doped quartz glass member is shaped into a desired shape suited for a particular EUV lithography member such as a mirror, stage or photomask substrate, by hot working at a temperature of 1,500 to 1,800° C. for 1 to 10 hours. Preferably hot working is conducted such that the axis of the shape is parallel to the growth axis of the titania and sulfur co-doped quartz glass grown in the manufacture furnace. It is noted that the titania and sulfur co-doped quartz glass member preferably has a diameter of up to 1,000 mm. A member having a diameter beyond the limit is difficult to maintain an appropriate temperature gradient during hot working and to minimize a temperature variation in the furnace.

After the hot working, the titania and sulfur co-doped quartz glass is annealed. The annealing step is effective for mitigating any strain or distortion induced in the titania and sulfur co-doped quartz glass by hot working. Annealing may be conducted under well-known conditions, for example, at a temperature of 700 to 1,300° C. in air for 1 to 200 hours. This may be followed by cooling from the annealing temperature to 500° C. at a rate of 1 to 20° C./hr. The annealing treatment may reduce the fictive temperature of titania and sulfur co-doped quartz glass.

Preferably the titania and sulfur co-doped quartz glass member has a fictive temperature of lower than or equal to 1,200° C., more preferably lower than or equal to 1,150° C., and even more preferably lower than or equal to 1,100° C. Since the CTE of titania and sulfur co-doped quartz glass depends on the distribution of fictive temperature, it preferably has a fictive temperature distribution ($\Delta FT$) of lower than or equal to 30° C., more preferably lower than or equal to 20° C., and even more preferably lower than or equal to 10° C. A fictive temperature distribution within this range may be achieved by effecting annealing treatment and controlling the OH group concentration distribution as described above. It is noted that the fictive temperature of titania and sulfur co-doped quartz glass may be measured by the method described in J. Non-Cryst. Solids, 185, 191 (1995).

After the annealing treatment, the titania and sulfur co-doped quartz glass is worked into a predetermined size by machining or slicing and then polished by a double-side lapping machine with an abrasive such as silicon oxide, aluminum oxide, molybdenum oxide, silicon carbide, diamond, cerium oxide or colloidal silica, thereby forming an EUV lithography member. From the titania and sulfur co-doped quartz glass, EUV lithography photomask substrates can be formed in which the difference between the highest and the lowest positions (also referred to as peak-to-valley (P-V) flatness) within a central region of 142.4 mm×142.4 mm square in the substrate surface as polished is up to 200 nm, preferably up to 100 nm. A substrate having a P-V flatness in the range may be obtainable by polishing quartz glass by means of a double-side lapping machine and concurrently local polishing by ion beam, plasma etching or the like. If the P-V flatness is above the limit, proper focusing may be difficult in the EUV lithography. It is noted that the P-V flatness may be determined by a Fizeau interferometer (Zygo Mark IV). EUV lithography mirror materials, especially mirror materials having a diameter of 500 mm or smaller, are also formed from the titania and sulfur co-doped quartz glass.

EXAMPLE

Examples and Comparative Examples are given below for illustrating the invention although the invention is not limited thereto.

Example 1

Figure 5A:
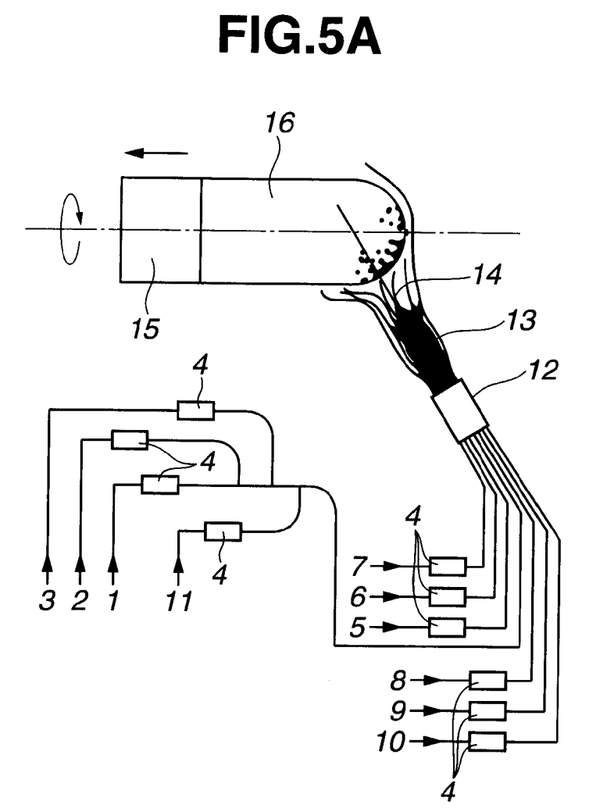
Figure 5B:
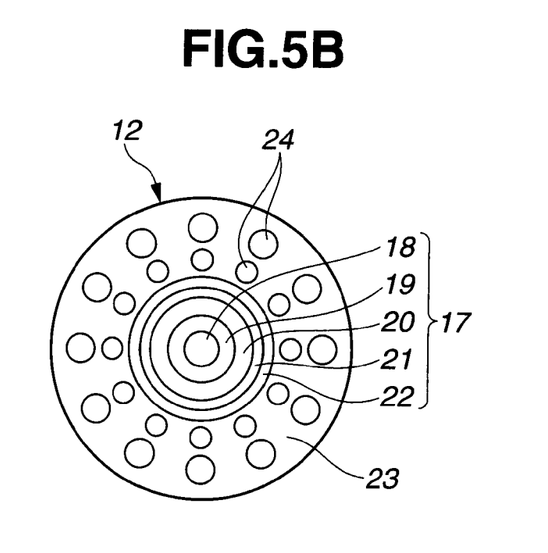

A burner as shown in FIG. 5 was used which is described in JP-A H08-031723. The titania-doped quartz glass manufacture system illustrated in FIG. 5a includes a $SiCl_4$ feed line 1, a $TiCl_4$ feed line 2, a $SCl_2$ feed line 3, flow meters 4, hydrogen gas feed lines 5, 6 and 7, oxygen gas feed lines 8, 9, 10 and 11, a quartz main burner 12 for producing an oxyhydrogen flame 13 and titania and sulfur co-doped silica fine particles 14, and a support or target 15 on which an ingot 16 is grown. FIG. 5b is a transverse cross-section of burner 12, including a five-fold tube 17 consisting of five nozzles 18 to 22, an outer shell 23 outside tube 17, and nozzles 24 inside outer shell 23. The central or first nozzle 18 receives $SiCl_4$, $TiCl_4$, and $SCl_2$ from the $SiCl_4$, $TiCl_4$ and $SCl_2$ feed lines 1, 2 and 3 and oxygen gas from the oxygen gas feed line 11. An inert gas such as argon gas may also be fed if desired. The second and fourth nozzles 19 and 21 receive oxygen gas from the oxygen gas feed lines 8 and 9, and the third and fifth nozzles 20 and 22 receive hydrogen gas from the hydrogen gas feed lines 5 and 6. The outer shell 23 receives hydrogen gas from the hydrogen gas feed line 7, and the nozzle 24 receives oxygen gas from the oxygen gas feed line 10.

An ingot of titania and sulfur co-doped quartz glass was prepared by feeding the gases shown in Table 1 to the respective nozzles of the main burner, forming an oxyhydrogen flame, effecting hydrolytic reaction of silicon tetrachloride, titanium tetrachloride, and sulfur dichloride in the oxyhydrogen flame to produce $SiO_2$, $TiO_2$, and $SO_2$, depositing and simultaneously melting and vitrifying titania and sulfur co-doped silica fine particles on a target disposed forward of the burner, and continuing growth. The target was rotated at 50 rpm and retracted at 10 mm/hr. The flow rates of different gases were kept within a variation of ±0.2%. During preparation of titania-doped quartz glass in the manufacture furnace, the temperatures of air to the furnace, exhaust gas from the furnace and ambient air around the furnace were kept within a variation of ±1° C.

The resulting ingot of 120 mm diameter and 400 mm length was hot worked by heating at 1,700° C. for 6 hours. The ingot was held in air at 1,100° C. for 150 hours for annealing, and then slowly cooled down to 500° C. at a rate of 5° C./hr. The ingot as annealed was machined to a square prism of 152.4 mm×152.4 mm, obtaining a titania and sulfur co-doped quartz glass ingot I. This ingot I was machined into a substrate by slicing. The quartz glass substrate was polished for 6 hours by a double-side lapping machine Model 12B (Fujikoshi Machinery Corp.) using a suede-type polishing pad and cerium oxide abrasive and then for 1 hour using colloidal silica abrasive instead. This resulted in a substrate of 1 mm thick having both surfaces mirror polished. The polished substrate was measured for OH group concentration distribution, fictive temperature distribution, titania concentration, and sulfur concentration along a diagonal, with maximum and minimum values thereof being reported in Table 2.

Figure 1:
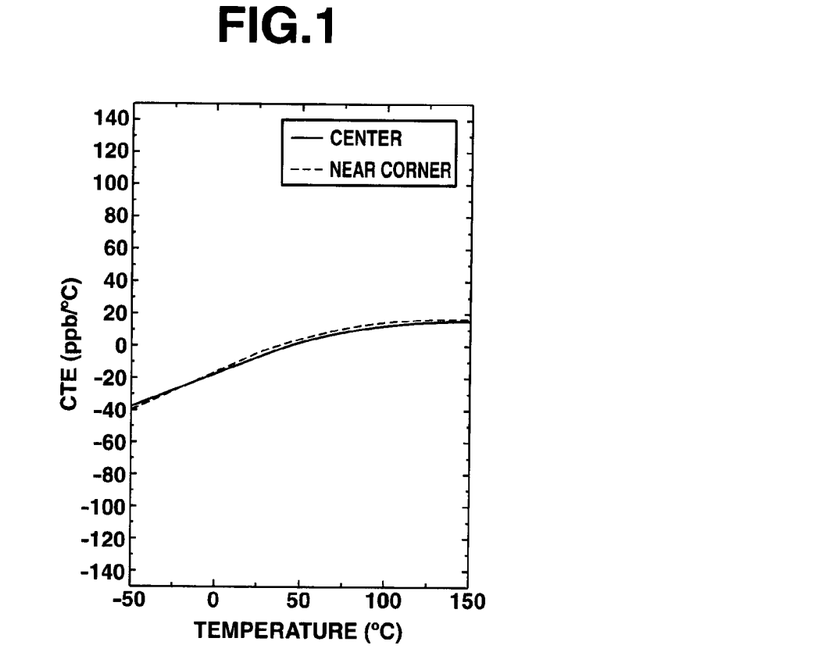
FIG. 1 is a diagram showing thermal expansion curves of a titania and sulfur co-doped quartz glass ingot prepared in Example 1 at its center and near the corner.

Samples for a thermal expansion test were cut out of ingot I from the center within the 152.4 mm×152.4 mm square and a (near corner) position diagonally spaced 100 mm from the center, from which thermal expansion curves were determined in a temperature range of −50° C. to 150° C. The results are shown in the diagram of FIG. 1. The maximum value among absolute values of thermal expansion curve gradient in each of the temperature ranges of −50° C. to 150° C. and 0° C. to 100° C. is reported in Table 3. The maximum value among absolute values of CTE in each of the temperature ranges of −50° C. to 150° C., 0° C. to 100° C., and 20° C. to 80° C. is also reported in Table 3. Finally the temperature at which the CTE becomes zero on the thermal expansion curve in the temperature range of −50° C. to 150° C., referred to as "zero expansion temperature", is reported in Table 3.

From titania and sulfur co-doped quartz glass ingot I, a substrate of 6.7 mm thick was sliced. It was polished for 6 hours by a double-side lapping machine Model 12B (Fujikoshi Machinery Corp.) using a suede-type polishing pad and cerium oxide abrasive and then for 1 hour using colloidal silica abrasive. The polished substrate had a thickness of 6.35 mm. For the substrate thus obtained, a difference between the highest and lowest positions in a central region of 142.4 mm×142.4 mm square in the substrate surface was measured using a laser interferometer. The result is reported in Table 2 as P-V flatness in exposure-accessible region.

It was demonstrated that the titania and sulfur co-doped quartz glass substrate obtained had an appropriate zero expansion temperature for use in a commercially available EUV lithography tool, a wide temperature range for low thermal expansion, and a low P-V flatness in a central region of 142.4 mm×142.4 mm square in the polished substrate surface, and was best suited as EUV lithography photomask substrates.

Example 2

An ingot of titania and sulfur co-doped quartz glass was prepared using the burner system shown in FIG. 5, specifically by feeding the gases shown in Table 1 to the respective nozzles of the main burner, forming an oxyhydrogen flame, effecting hydrolytic reaction of silicon tetrachloride, titanium tetrachloride, and sulfur dichloride in the oxyhydrogen flame to produce $SiO_2$, $TiO_2$, and $SO_2$, and depositing and simultaneously melting and vitrifying titania and sulfur co-doped silica fine particles on a target disposed forward of the burner. The target was rotated at 2 rpm and retracted at 10 mm/hr. The flow rates of different gases were kept within a variation of ±0.2%. During preparation of titania-doped quartz glass in the manufacture furnace, the temperatures of air to the furnace, exhaust gas from the furnace and ambient air around the furnace were kept within a variation of ±1° C.

The resulting ingot of 120 mm diameter and 400 mm length was hot worked by heating at 1,700° C. for 6 hours. The ingot was held in air at 1,100° C. for 150 hours for annealing, and then slowly cooled down to 500° C. at a rate of 5° C./hr. The ingot as annealed was machined to a square prism of 152.4 mm×152.4 mm, obtaining a titania and sulfur co-doped quartz glass ingot II. This ingot II was machined into a substrate by slicing. The quartz glass substrate was polished for 6 hours by a double-side lapping machine Model 12B (Fujikoshi Machinery Corp.) using a suede-type polishing pad and cerium oxide abrasive and then for 1 hour using colloidal silica abrasive instead. This resulted in a substrate of 1 mm thick having both surfaces mirror polished. The polished substrate was measured for OH group concentration distribution, fictive temperature distribution, titania concentration, and sulfur concentration along a diagonal, with maximum and minimum values thereof being reported in Table 2.

Figure 2:
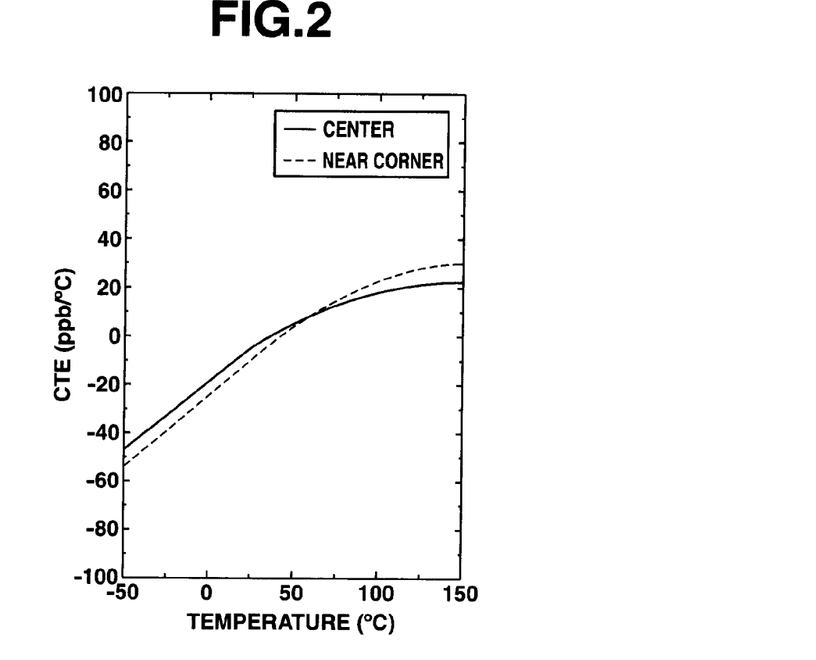
FIG. 2 is a diagram showing thermal expansion curves of a titania and sulfur co-doped quartz glass ingot prepared in Example 2 at its center and near the corner.

Samples for a thermal expansion test were cut out of ingot II from the center within the 152.4 mm×152.4 mm square and a (near corner) position diagonally spaced 100 mm from the center, from which thermal expansion curves were determined in a temperature range of −50° C. to 150° C. The results are shown in the diagram of FIG. 2. The maximum value among absolute values of thermal expansion curve gradient in each of the temperature ranges of −50° C. to 150° C. and 0° C. to 100° C. is reported in Table 3. The maximum value among absolute values of CTE in each of the temperature ranges of −50° C. to 150° C., 0° C. to 100° C., and 20° C. to 80° C. is also reported in Table 3. Finally the temperature at which the CTE becomes zero on the thermal expansion curve in the temperature range of −50° C. to 150° C., referred to as "zero expansion temperature", is reported in Table 3.

From titania and sulfur co-doped quartz glass ingot II, a substrate of 6.7 mm thick was sliced. It was polished for 6 hours by a double-side lapping machine Model 12B (Fujikoshi Machinery Corp.) using a suede-type polishing pad and cerium oxide abrasive and then for 1 hour using colloidal silica abrasive. The polished substrate had a thickness of 6.35 mm. For the substrate thus obtained, a difference between the highest and lowest positions in a central region of 142.4 mm×142.4 mm square in the substrate surface was measured using a laser interferometer. The result is reported in Table 2 as P-V flatness in exposure-accessible region.

It was demonstrated that the titania and sulfur co-doped quartz glass substrate obtained had an appropriate zero expansion temperature for use in a commercially available EUV lithography tool, a wide temperature range for low thermal expansion, and a low P-V flatness in a central region of 142.4 mm×142.4 mm square in the polished substrate surface, and was best suited as EUV lithography photomask substrates. The substrate near the corner showed a thermal expansion curve different from that at the center.

Example 3

An ingot of titania and sulfur co-doped quartz glass was prepared using the burner system shown in FIG. 5, specifically by feeding the gases shown in Table 1 to the respective nozzles of the main burner, forming an oxyhydrogen flame, effecting hydrolytic reaction of silicon tetrachloride, titanium tetrachloride, and sulfur dichloride in the oxyhydrogen flame to produce $SiO_2$, $TiO_2$, and $SO_2$, and depositing and simultaneously melting and vitrifying titania and sulfur co-doped silica fine particles on a target disposed forward of the burner. The target was rotated at 50 rpm and retracted at 10 mm/hr. The flow rates of different gases were kept within a variation of ±0.2%. During preparation of titania-doped quartz glass in the manufacture furnace, the temperatures of air to the furnace, exhaust gas from the furnace and ambient air around the furnace were kept within a variation of ±1° C.

The resulting ingot of 120 mm diameter and 400 mm length was hot worked by heating at 1,700° C. for 6 hours. The ingot was held in air at 1,100° C. for 150 hours for annealing. With the power supply to the annealing furnace turned off, the ingot was quenched to room temperature (at about 600° C./hr). The ingot as annealed was machined to a square prism of 152.4 mm×152.4 mm, obtaining a titania and sulfur co-doped quartz glass ingot III. This ingot III was machined into a substrate by slicing. The quartz glass substrate was polished for 6 hours by a double-side lapping machine Model 12B (Fujikoshi Machinery Corp.) using a suede-type polishing pad and cerium oxide abrasive and then for 1 hour using colloidal silica abrasive instead. This resulted in a substrate of 1 mm thick having both surfaces mirror polished. The polished substrate was measured for OH group concentration distribution, fictive temperature distribution, titania concentration, and sulfur concentration along a diagonal, with maximum and minimum values thereof being reported in Table 2.

Figure 3:
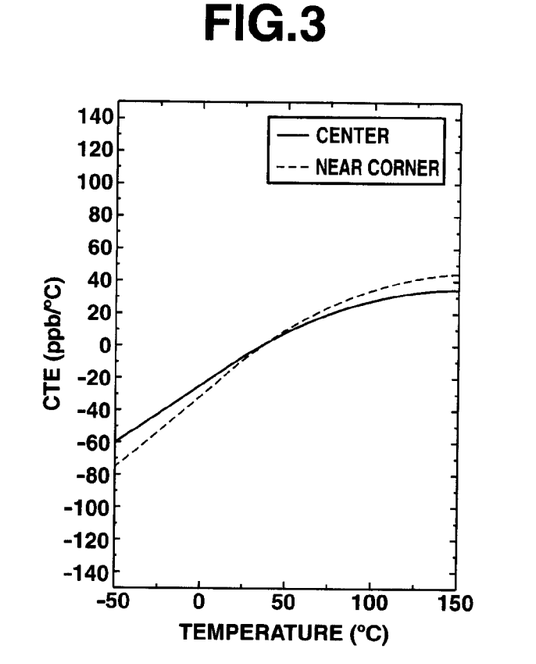
FIG. 3 is a diagram showing thermal expansion curves of a titania and sulfur co-doped quartz glass ingot prepared in Example 3 at its center and near the corner.

Samples for a thermal expansion test were cut out of ingot III from the center within the 152.4 mm×152.4 mm square and a (near corner) position diagonally spaced 100 mm from the center, from which thermal expansion curves were determined in a temperature range of −50° C. to 150° C. The results are shown in the diagram of FIG. 3. The maximum value among absolute values of thermal expansion curve gradient in each of the temperature ranges of −50° C. to 150° C. and 0° C. to 100° C. is reported in Table 3. The maximum value among absolute values of CTE in each of the temperature ranges of −50° C. to 150° C., 0° C. to 100° C., and 20° C. to 80° C. is also reported in Table 3. Finally the temperature at which the CTE becomes zero on the thermal expansion curve in the temperature range of −50° C. to 150° C., referred to as "zero expansion temperature", is reported in Table 3.

From titania and sulfur co-doped quartz glass ingot III, a substrate of 6.7 mm thick was sliced. It was polished for 6 hours by a double-side lapping machine Model 12B (Fujikoshi Machinery Corp.) using a suede-type polishing pad and cerium oxide abrasive and then for 1 hour using colloidal silica abrasive. The polished substrate had a thickness of 6.35 mm. For the substrate thus obtained, a difference between the highest and lowest positions in a central region of 142.4 mm×142.4 mm square in the substrate surface was measured using a laser interferometer. The result is reported in Table 2 as P-V flatness in exposure-accessible region.

It was demonstrated that the titania and sulfur co-doped quartz glass substrate obtained had an appropriate zero expansion temperature for use in a commercially available EUV lithography tool, a wide temperature range for low thermal expansion, and a low P-V flatness in a central region of 142.4 mm×142.4 mm square in the polished substrate surface, and was best suited as EUV lithography photomask substrates. The substrate near the corner showed a thermal expansion curve different from that at the center.

Comparative Example 1

An ingot of titania-doped quartz glass was prepared using the burner system shown in FIG. 5, specifically by feeding the gases shown in Table 1 to the respective nozzles of the main burner, forming an oxyhydrogen flame, effecting hydrolytic reaction of silicon tetrachloride and titanium tetrachloride in the oxyhydrogen flame to produce $SiO_2$ and $TiO_2$, and depositing and simultaneously melting and vitrifying titania-doped silica fine particles on a target disposed forward of the burner. The target was rotated at 50 rpm and retracted at 10 mm/hr. The flow rates of different gases were kept within a variation of ±0.2%. During preparation of titania-doped quartz glass in the manufacture furnace, the temperatures of air to the furnace, exhaust gas from the furnace and ambient air around the furnace were kept within a variation of ±1° C.

The resulting ingot of 120 mm diameter and 400 mm length was hot worked by heating at 1,700° C. for 6 hours. The ingot was held in air at 1,100° C. for 150 hours for annealing and then slowly cooled down to 500° C. at a rate of 5° C./hr. The ingot as annealed was machined to a square prism of 152.4 mm×152.4 mm, obtaining a titania-doped quartz glass ingot IV. This ingot IV was machined into a substrate by slicing. The quartz glass substrate was polished for 6 hours by a double-side lapping machine Model 12B (Fujikoshi Machinery Corp.) using a suede-type polishing pad and cerium oxide abrasive and then for 1 hour using colloidal silica abrasive instead. This resulted in a substrate of 1 mm thick having both surfaces mirror polished. The polished substrate was measured for OH group concentration distribution, fictive temperature distribution, titania concentration, and sulfur concentration along a diagonal, with maximum and minimum values thereof being reported in Table 2.

Figure 4:
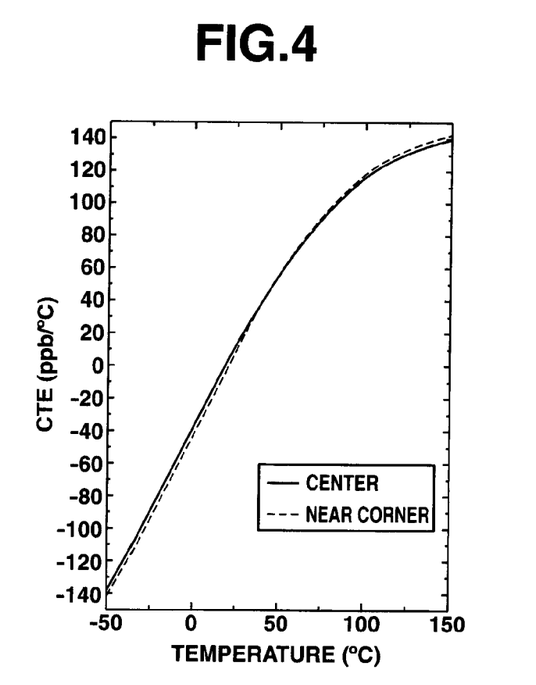
FIG. 4 is a diagram showing thermal expansion curves of a titania and sulfur co-doped quartz glass ingot prepared in Comparative Example 1 at its center and near the corner.

Samples for a thermal expansion test were cut out of ingot IV from the center within the 152.4 mm×152.4 mm square and a (near corner) position diagonally spaced 100 mm from the center, from which thermal expansion curves were determined in a temperature range of −50° C. to 150° C. The results are shown in the diagram of FIG. 4. The maximum value among absolute values of thermal expansion curve gradient in each of the temperature ranges of −50° C. to 150° C. and 0° C. to 100° C. is reported in Table 3. The maximum value among absolute values of CTE in each of the temperature ranges of −50° C. to 150° C., 0° C. to 100° C., and 20° C. to 80° C. is also reported in Table 3. Finally the temperature at which the CTE becomes zero on the thermal expansion curve in the temperature range of −50° C. to 150° C., referred to as "zero expansion temperature", is reported in Table 3.

From titania-doped quartz glass ingot IV, a substrate of 6.7 mm thick was sliced. It was polished for 6 hours by a double-side lapping machine Model 12B (Fujikoshi Machinery Corp.) using a suede-type polishing pad and cerium oxide abrasive and then for 1 hour using colloidal silica abrasive. The polished substrate had a thickness of 6.35 mm. For the substrate thus obtained, a difference between the highest and lowest positions in a central region of 142.4 mm×142.4 mm square in the substrate surface was measured using a laser interferometer. The result is reported in Table 2 as P-V flatness in exposure-accessible region.

The titania-doped quartz glass substrate obtained had a sharp gradient of thermal expansion curve and a widely varying CTE in the operating temperature range of a commercially available EUV lithography tool.

TABLE 1

| Main burner | | | Examples 1 to 3 | Comparative Example 1 |
|---|---|---|---|---|
| Gas flow rate ($Nm^3$/hr) | 1 | $SiCl_4$ | 1,250 g/hr | 1,250 g/hr |
| | | $TiCl_4$ | 150 g/hr | 150 g/hr |
| | | $SCl_2$ | 50 g/hr | 0 g/hr |
| | | $O_2$ | 2 | 2 |
| | 2 | $O_2$ | 1 | 1 |
| | 3 | $H_2$ | 15 | 15 |
| | 4 | $O_2$ | 8 | 8 |
| | 5 | $H_2$ | 10 | 10 |
| | 6 | $O_2$ | 10 | 10 |
| | 7 | $H_2$ | 20 | 20 |

TABLE 2

| | | Titania concentration (wt %) | | Sulfur concentration (ppm) | | OH group concentration distribution (ppm) | | Fictive temperature distribution (° C.) | | P-V flatness |
|---|---|---|---|---|---|---|---|---|---|---|
| | | Max | Min | Max | Min | Max | Min | Max | Min | (nm) |
| Example | 1 | 7.5 | 7.3 | 1050 | 1021 | 794 | 763 | 925 | 920 | 67 |
| | 2 | 7.5 | 7.2 | 1080 | 1008 | 878 | 632 | 982 | 970 | 72 |
| | 3 | 7.6 | 7.2 | 1015 | 1005 | 802 | 780 | 1082 | 996 | 59 |
| Comparative Example | 1 | 7.6 | 7.3 | 0 | 0 | 800 | 788 | 918 | 910 | 62 |

TABLE 3

| | | Thermal expansion curve gradient (absolute value, ppb/° C.$^2$) | | CTE (absolute value, ppb/° C.) | | | Zero expansion temperature (° C.) |
|---|---|---|---|---|---|---|---|
| | | −50 to 150° C. | 0 to 100° C. | −50 to 150° C. | 0 to 100° C. | 20 to 80° C. | |
| Example 1 | center | 0.44 | 0.43 | 38 | 17 | 10 | 44 |
| | near corner | 0.49 | 0.47 | 40 | 16 | 12 | 38 |
| Example 2 | center | 0.60 | 0.56 | 48 | 19 | 15 | 37 |
| | near corner | 0.63 | 0.63 | 55 | 26 | 16 | 44 |
| Example 3 | center | 0.75 | 0.73 | 60 | 28 | 22 | 35 |
| | near corner | 0.92 | 0.91 | 75 | 36 | 28 | 36 |
| Comparative Example 1 | center | 2.11 | 2.09 | 141 | 117 | 97 | 19 |
| | near corner | 2.15 | 2.15 | 143 | 119 | 99 | 21 |

Japanese Patent Application No. 2009-260558 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a titania-doped quartz glass member, comprising the steps of subjecting a feed of a silicon source gas and a titanium source gas to flame hydrolysis with the aid of a combustible gas and a combustion-supporting gas, to form synthetic silica fine particles, depositing the silica fine particles on a rotating target, and concurrently melting and vitrifying the particles to form titania-doped quartz glass, the feed further comprising a sulfur source gas whereby the resultant quartz glass is co-doped with titania and sulfur.

2. The method of claim 1 wherein the sulfur source comprises a sulfur oxide or chloride.

3. The method of claim 1 wherein flow rates of the combustible gas, the combustion-supporting gas, the feed of the silicon source gas, the feed of the titanium source gas, and the feed of the sulfur source gas are controlled within a variation of ±1%, and a temperatures of air flowing through a quartz glass-manufacturing furnace, exhaust gas from the furnace, and ambient air surrounding the furnace are controlled within a variation of ±2.5° C.

4. The method of claim 1 wherein the rotating target is rotated at a rotational speed of at least 2 rpm.

5. The method of claim 1 wherein the rotating target is rotated at a rotational speed of at least 5 rpm.

6. The method of claim 1 wherein the rotating target is rotated at a rotational speed of at least 15 rpm.

7. The method of claim 3 wherein the flow rates of the feed of the silicon source gas, the feed of the titanium source gas, the feed of the sulfur source gas, the combustible gas, and the combustion-supporting gas are each controlled within a variation of ±0.5%.

8. The method of claim 1 wherein the titania and sulfur co-doped quartz glass member has a diameter of up to 1,000 mm.

9. The method of claim 1 wherein the titania and sulfur co-doped quartz glass member is formed into a desired shape by hot working at a temperature of 1,500 to 1,800° C. for 1 to 10 hours such that the axis of the desired shape is parallel to a growth axis of the titania and sulfur co-doped quartz glass grown in the manufacture furnace.

10. The method of claim 9 wherein after the hot working, the titania and sulfur co-doped quartz glass is annealed at a temperature of 700 to 1,300° C. in air for 1 to 200 hours, followed by cooling from the annealing temperature to 500° C. at a rate of 1 to 20° C./hr.

11. The method of claim 1 wherein the titania and sulfur co-doped quartz glass contains 3 to 10% by weight of titania and 10 to 50,000 ppm of sulfur.

* * * * *